US012685082B2

(12) United States Patent  
Kim et al.

(10) Patent No.: US 12,685,082 B2  
(45) Date of Patent: Jul. 14, 2026

(54) CRANE DEVICE, DRIVING METHOD THEREOF, AND STOCKER INCLUDING SAME

(71) Applicant: SEMES CO., LTD., Chungcheongnam-do (KR)

(72) Inventors: Seok Hee Kim, Gyeonggi-do (KR); Eun Sang Yoon, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 490 days.

(21) Appl. No.: 18/078,095

(22) Filed: Dec. 9, 2022

(65) Prior Publication Data

US 2023/0215755 A1 Jul. 6, 2023

(30) Foreign Application Priority Data

Dec. 30, 2021 (KR) ........................ 10-2021-0191910

(51) Int. Cl.  
*H10P 72/30* (2026.01)  
*B65G 1/04* (2006.01)

(52) U.S. Cl.  
CPC ........ *H10P 72/3404* (2026.01); *B65G 1/0407* (2013.01); *B65G 1/0421* (2013.01)

(58) Field of Classification Search  
CPC .......... H01L 21/67769; H01L 21/6773; B65G 1/0407; B65G 1/0421; B65G 1/04;

(Continued)

(56) References Cited

U.S. PATENT DOCUMENTS 4,773,807 A * 9/1988 Kroll .................... B65G 1/0485  
6,325,586 B1 * 12/2001 Loy ......................... B65G 1/02  
(Continued)

FOREIGN PATENT DOCUMENTS

CN 102143899 B * 12/2013 ........... B65G 1/0407  
DE 19921246 C2 * 6/2003 ................ A61P 3/06  
(Continued)

OTHER PUBLICATIONS

Office Action dated Jul. 10, 2023 for Korean Patent Application No. 10-2021-0191910 and its English translation from Global Dossier.

(Continued)

*Primary Examiner* — Ellis B. Ramirez  
(74) *Attorney, Agent, or Firm* — WOMBLE BOND DICKINSON (US) LLP

(57) ABSTRACT

A crane device comprises: a first crane robot; and a second crane robot. The first crane robot comprises: a first column configured to be movable in a first direction and extend in a second direction; a first arm unit configured to be movable along the first column; and a first drive unit installed in an upper part of the first column and configured to move the first column in the first direction, and the second crane robot comprises: a second column configured to be movable in the first direction and extend in the second direction and spaced apart from the first column; a second arm unit configured to be movable along the second column; and a second drive unit installed in a lower part of the second column and configured to move the second column in the first direction.

20 Claims, 12 Drawing Sheets

(58) Field of Classification Search
CPC .. B65G 2201/0297; B66F 11/04; B66F 13/00; B66C 7/08
USPC ......... 700/256, 214; 414/279, 282, 283, 615
See application file for complete search history.

(56) References Cited

U.S. PATENT DOCUMENTS

| | | | |
|---|---|---|---|
| 6,516,234 B2 * | 2/2003 | Kamiguchi | ........ G05B 19/4185 |
| 7,949,423 B2 | 5/2011 | Tsukamoto | |
| 9,221,604 B2 * | 12/2015 | Takagawa | ............ B65G 1/0407 |
| 9,315,320 B2 * | 4/2016 | Kawano | ............... B65G 1/0492 |
| 2004/0109746 A1 * | 6/2004 | Suzuki | .............. H01L 21/67733 |
| 2005/0010324 A1 * | 1/2005 | Kaever | ............. G05B 19/4061 |
| 2008/0053941 A1 * | 3/2008 | Tsukamoto | .......... B65G 1/0421 |
| 2011/0276175 A1 | 11/2011 | Takagawa et al. | |
| 2020/0172333 A1 * | 6/2020 | Motoori | ............... B65G 1/0457 |

FOREIGN PATENT DOCUMENTS

| | | | | |
|---|---|---|---|---|
| DE | 102019109841 A1 * | 10/2019 | ................ | B66F 9/07 |
| JP | 2002-175117 | 6/2002 | | |
| JP | 2007055698 A * | 3/2007 | | |
| JP | 4756371 B2 * | 8/2011 | .......... | B65G 1/0421 |
| KR | 10-2006-0077953 | 7/2006 | | |
| KR | 10-2008-0022040 | 3/2008 | | |
| KR | 10-2011-0050650 | 5/2011 | | |
| KR | 10-2016-0109635 | 9/2016 | | |
| KR | 10-2020-0121355 | 10/2020 | | |

OTHER PUBLICATIONS

Notice of Allowance dated Feb. 20, 2024 for Korean Patent Application No. 10-2021- 0191910 and its English translation from Global Dossier.

Office Action (1st) dated Jul. 15, 2025 for Chinese Patent Application No. 202211592352.1 and its English translation provided by Applicant's foreign counsel/Global Dossier.

Office Action (2nd) dated Nov. 26, 2025 for Chinese Patent Application No. 202211592352.1 and its English translation provided by Applicant's foreign counsel/Global Dossier.

* cited by examiner

CRANE DEVICE, DRIVING METHOD THEREOF, AND STOCKER INCLUDING SAME

CROSS-REFERENCE TO RELATED APPLICATION

This application claims priority from Korean Patent Application No. 10-2021-0191910 filed on Dec. 30, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a crane device, a driving method thereof, and a stocker including the same.

2. Description of the Related Art

In the manufacturing process of a semiconductor device, a substrate may be transported through an unmanned transport system. Specifically, the unmanned transport system may include a transport vehicle (e.g., an overhead hoist transport (OHT) and a rail guided vehicle (RGV)) configured to move along a drive rail installed on the ceiling or floor of a clean room. The transport vehicle transports a container where a substrate is loaded (e.g., a front open shipping box (FOSB) and a front open unified pod (FOUP)). The operation control of the transport vehicle may be controlled by an upper control device such as an OHT control Server (OCS) device.

SUMMARY

Meanwhile, a transport vehicle may transport a container where a substrate is loaded, to a stocker, and the stocker may accommodate, load, and stock the container. The stocker includes a plurality of shelves capable of storing containers, as well as a crane robot capable of transporting containers within the stocker. However, with an increase in the capacity of the stocker (i.e., as the number of shelves increases), the efficiency of the crane robot decreases. Said differently, with an increase in the number of shelves, it takes a longer time for the crane robot to move in the stocker in an end-to-end manner. This causes a bottleneck and adversely affects semiconductor productivity.

Aspects of the present disclosure provide a crane device with a plurality of crane robots within a limited space to improve the transport efficiency of a container.

Aspects of the present disclosure also provide a stocker including the limited crane device.

Aspects of the present disclosure also provide a driving method of the crane device.

The technical aspects of the present disclosure are not restricted to those set forth herein, and other unmentioned technical aspects will be clearly understood by one of ordinary skill in the art to which the present disclosure pertains by referencing the detailed description of the present disclosure given below.

Technical Solution

According to an aspect of the present disclosure, there is provided a crane device comprising: a first crane robot; and a second crane robot, wherein the first crane robot comprises: a first column configured to be movable in a first direction and extend in a second direction; a first arm unit configured to be movable along the first column; and a first drive unit installed in an upper part of the first column and configured to move the first column in the first direction, and the second crane robot includes: a second column configured to be movable in the first direction and extend in the second direction and spaced apart from the first column; a second arm unit configured to be movable along the second column; and a second drive unit installed in a lower part of the second column and configured to move the second column in the first direction. When the first column and the second column are disposed in parallel in a third direction perpendicular to the first and second directions, the first arm unit at least partially overlaps with the second arm unit in the second direction.

According to an aspect of the present disclosure, there is also provided a stocker comprising: a first stocking unit including a plurality of first shelves and extending in a first direction; a second stocking unit spaced apart from the first stocking unit, including a plurality of second shelves and extending in the first direction; and a first crane robot and a second crane robot disposed between the first stocking unit and the second stocking unit. The first crane robot includes: a first column configured to be movable in the first direction and extend in a second direction; a first arm unit configured to be movable along the first column; a first support block installed on an upper part of the first column and protruding in a third direction perpendicular to the first direction and the second direction; a first drive unit installed in the first support block and configured to move the first column in the first direction; and a first lower guide unit installed in a lower part of the first column and configured to guide a movement direction of the first column. The second crane robot includes: a second column configured to be movable in the first direction and extend in the second direction and spaced apart from the first column; a second arm unit configured to be movable along the second column; a second support block installed in a lower part of the second column and protruding in the third direction; a second drive unit installed in the second support block and configured to move the second column in the first direction; and a second upper guide unit installed in an upper part of the second column and configured to guide a movement direction of the second column.

According to an aspect of the present disclosure, there is also provided a driving method of the crane device comprising: providing a stocker comprising: a first stocking unit including a plurality of first shelves and extending in a first direction; a second stocking unit spaced apart from the first stocking unit, including a plurality of second shelves and extending in the first direction; and a first crane robot and a second crane robot disposed between the first stocking unit and the second stocking unit, wherein the first crane robot includes a first column configured to be movable in the first direction, a first arm unit configured to be movable along the first column, and a first drive unit installed in an upper part of the first column and configured to move the first column in the first direction, and the second crane robot includes a second column configured to be movable in the first direction, a second arm unit configured to be movable along the second column, and a second drive unit installed in a lower part of the second column and configured to move the second column in the first direction; picking up a container in a first position of the second stocking unit by the first arm unit of the first crane robot; allowing the first crane robot to intersect the second crane robot and move to a second position, wherein, at the time of intersecting the first crane robot and the second crane robot, the first arm unit and the second arm unit are disposed at different heights, but at least partially overlap with each other; and putting down the container in the second position of the second stocking unit by the first arm unit of the first crane robot.

Specific details of other embodiments are included in the detailed description and the drawings.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
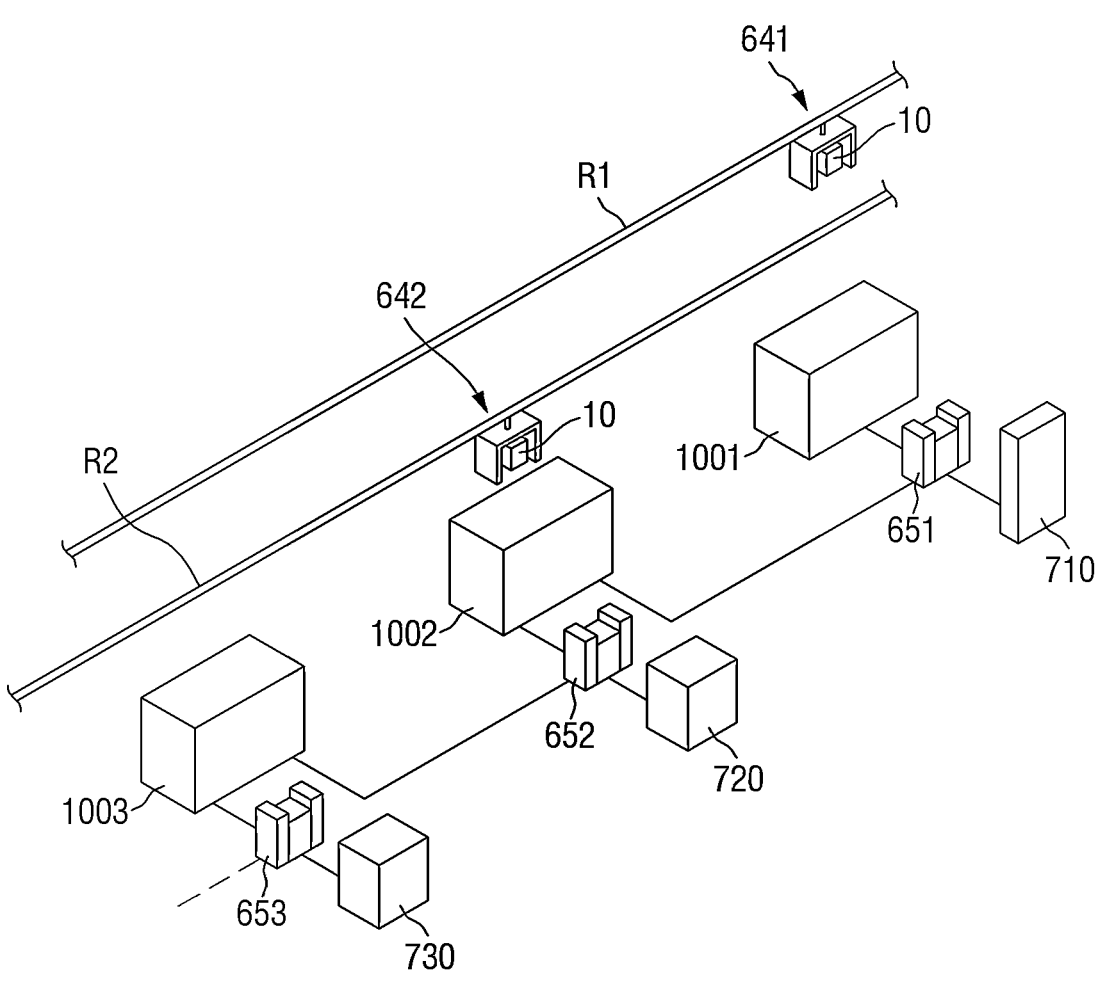
FIG. 1 is a view schematically illustrating a facility configuration of a semiconductor manufacturing line.

Hereinafter, embodiments of the present disclosure will be described with reference to the attached drawings. The merits and characteristics of the present disclosure and a method for achieving the merits and characteristics will become more apparent from the embodiments described in detail in conjunction with the accompanying drawings. However, the present disclosure is not limited to the disclosed embodiments, but may be implemented in various different ways. The embodiments are provided to only complete the disclosure of the present disclosure and to allow those skilled in the art to understand the category of the present disclosure. The present disclosure is defined by the category of the claims. Like numbers refer to like elements throughout the description of the figures.

The spatially relative terms "below", "beneath", "lower", "above" and "upper" may be used to easily describe the correlation of a device or components with other devices or components. Spatially relative terms are to be understood as including terms in different directions of the device in use or operation in addition to the directions shown in the figures. For example, when flipping a device shown in the figure, a device described as "below" or "beneath" of another device may be placed "above" of another device. Thus, the exemplary term "below" can encompass both an orientation of above and below. The device can also be oriented in other directions, so that spatially relative terms can be interpreted according to orientation.

Although the first, second, etc. are used to describe various elements, components and/or sections, these elements, components and/or sections are of course not limited by these terms. These terms are only used to distinguish one element, component or section from another element, component or section. Therefore, the first device, the first component, or the first section mentioned below may be a second device, a second component, or a second section within the technical spirit of the present disclosure.

Hereinafter, preferred embodiments according to the present disclosure are described in detail with reference to the accompanying drawings. The same or similar elements are assigned the same reference numerals irrespective of their reference numerals, and a redundant description thereof is omitted.

FIG. 1 is a view schematically illustrating a facility configuration of a semiconductor manufacturing line.

Referring to FIG. 1, the semiconductor manufacturing line includes a first ceiling transport vehicle 641, a second ceiling transport 642, a first stocker 1001, a second stocker 1002, a third stocker 1003, a labeling device 710, unit process devices 720 and 730, and rail transport vehicles 651, 652 and 653.

The first ceiling transport vehicle 641 and the second ceiling transport vehicle 642 may transport a container 10 within a wafer processing line and/or an EDS line. For example, the first ceiling transport vehicle 641 may include an overhead hoist transport (OHT), and the second ceiling transport vehicle 642 may include the OHT or an overhead shuttle (OHS). The container 10 may include a box with substrates loaded therein, such as a front open shipping box (FOSB) or a front open unified pod (FOUP). The first ceiling transport vehicle 641 may move along a first ceiling rail R1, and the second ceiling transport vehicle 642 may move along a second ceiling rail R2. For instance, the first ceiling rail R1 may be connected to a wafer processing line, and the second ceiling rail R2 may be installed in the EDS line, but the present disclosure is not limited thereto.

The first stocker 1001 may accommodate, load, and stock the container 10 transported through the first ceiling transport vehicle 641 or the second ceiling transport vehicle 642. The first stocker 1001 may provide the container 10 to the first rail transport vehicle 651.

The first rail transport vehicle 651 may transport the container 10 from the first stocker 1001 to the labeling device 710 and transport the container 10 from the labeling device 710 to the first stocker 1001 or the second stocker 1002.

The labeling device 710 may label the container 10 or an ID code of the substrate (wafer) loaded in the container 10. For instance, the labeling device 710 may write or attach an RFID tag or a bar code tag to/on the container 10 or the substrate.

The second stocker 1002 may accommodate, load, and stock the container 10 from the first rail transport vehicle 651, the first ceiling transport vehicle 641, and/or the second ceiling transport vehicle 642. The second stocker 1002 may provide the container 10 or the substrate loaded in the container 10 to the second rail transport vehicle 652.

The second rail transport vehicle 652 may transport the container 10 or a single substrate loaded in the second stocker 1002 to the unit process device 720 and transport the container 10 or the single substrate from the unit process device 720 to the third stocker 1003. The unit process device 720 may include electrical test equipment, laser repair equipment, grinding equipment, or inking equipment.

The third stocker 1003 may accommodate, load, and stock the container 10 or the single substrate transported from the second rail transport vehicle 652. The third stocker 1003 may provide the container 10 or the substrate loaded in the container 10 to the third rail transport vehicle 653.

The third rail transport vehicle 653 may transport the container 10 or the single substrate loaded in the third stocker 1003 to another unit process device 730 or other devices. In other words, the rail transport vehicles 651 to 653 may transport the container 10 or the single substrate between the stockers 1001 to 1003 and the unit process device 720.

Figure 2:
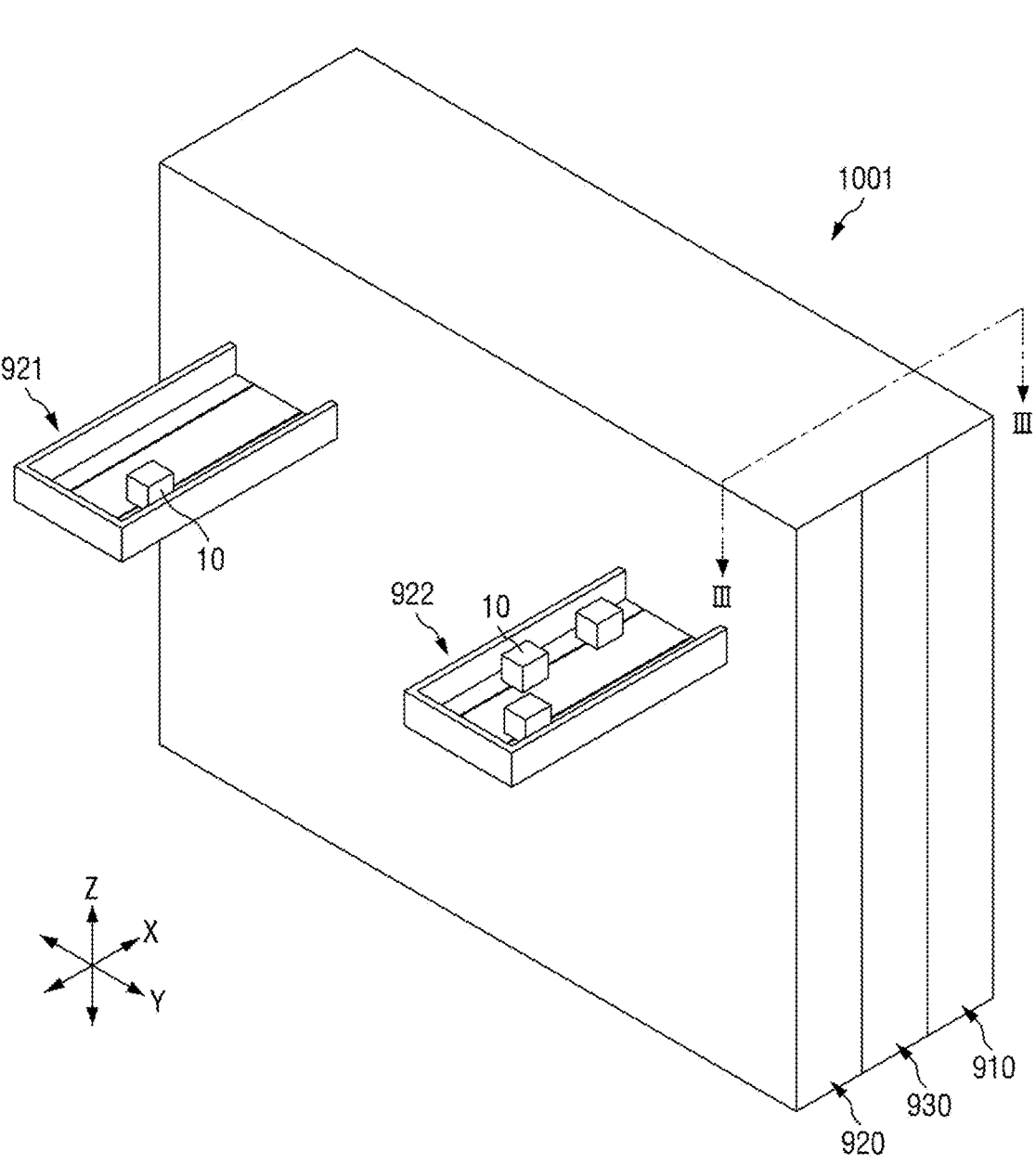
FIG. 2 is a conceptual view illustrating a stocker according to some embodiments of the present disclosure.

FIG. 2 is a conceptual view illustrating a stocker according to some embodiments of the present disclosure. FIG. 2 exemplarily illustrates the first stocker 1001 in FIG. 1.

Referring to FIG. 2, the first stocker 1001 includes a first stocking unit 910, a second stocking unit 920, and a transport area 930.

The first stocking unit 910 is disposed extending in a first direction Y, and a plurality of shelves may be arranged in a matrix form in the first direction Y and a second direction Z.

The second stocking unit 920 may also be disposed extending in the first direction Y in parallel with the first stocking unit 910, and the plurality of shelves may be arranged in the matrix form in the first direction Y and the second direction Z. The second stocking unit 920 is spaced apart from the first stocking unit 910 in a third direction X.

In addition, an inlet port 921 configured to carry in the container 10 and an outlet port 922 configured to carry out the container 10 may be installed in the second stocking unit 920. As illustrated, the inlet port 921 and the outlet port 922 may be physically separated, or the inlet port 921 and the outlet port 922 may be physically merged.

The transport area 930 is disposed between the first stocking unit 910 and the second stocking unit 920. A crane device 100 (see FIG. 3) to transport the container 10 in the stocker 1001 is installed in the transport area 930. The crane device 100 may move the container 10 provided to the inlet port 921 to the shelf of the first stocking unit 910 or the second stocking unit 920 or move the container 10 disposed on the shelf of the first stocking unit 910 or the second stocking unit 920 to the outlet port 922. Furthermore, the crane device 100 may move the container 10 in the first stocking unit 910 or the second stocking unit 920, or move from the first stocking unit 910 to the second stocking unit 920 or vice versa.

The configuration of the crane device 100 will be described with reference to FIGS. 3 to 5.

Figure 3:
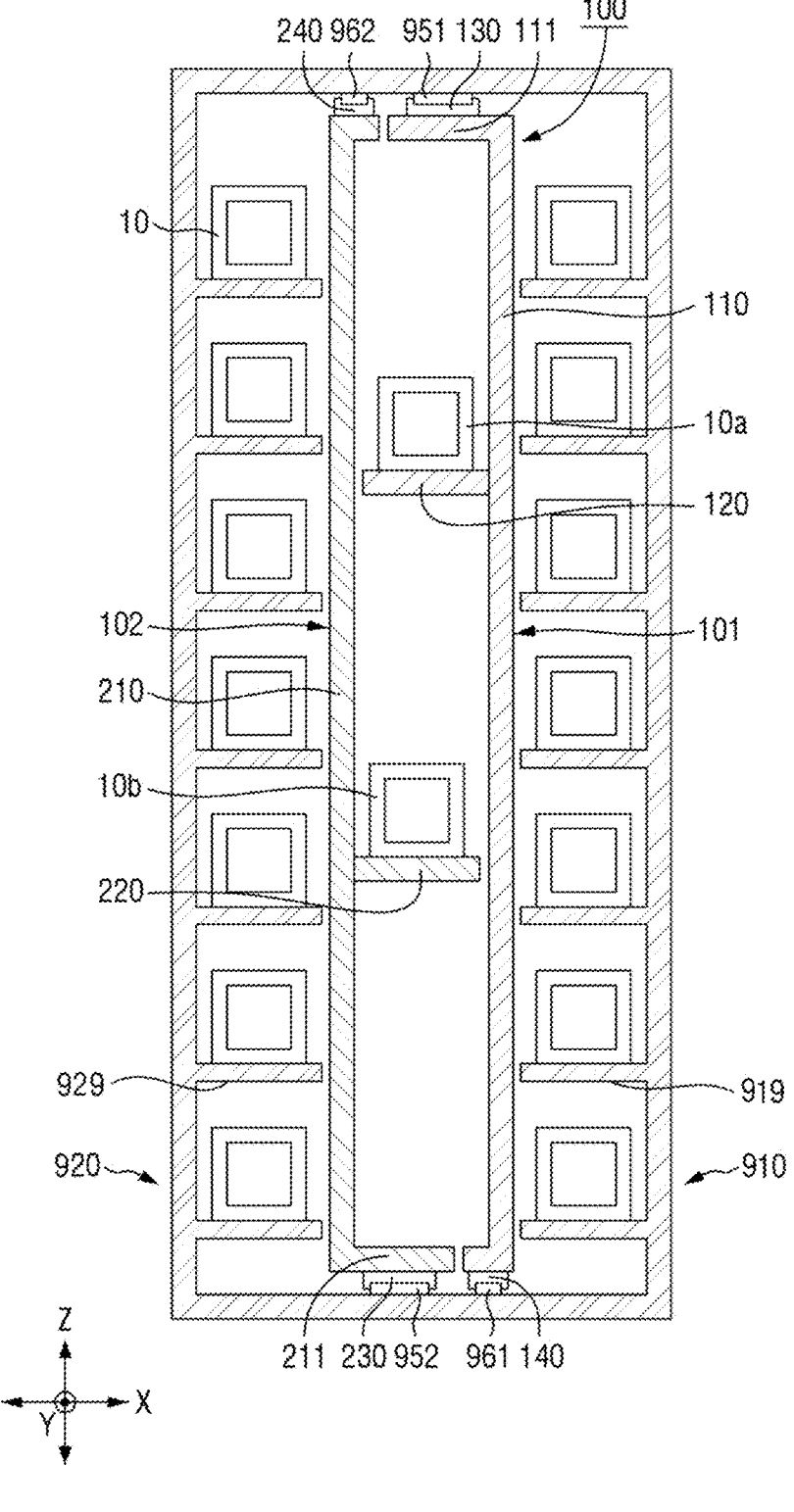
FIG. 3 is a sectional view illustrating a crane device according to one embodiment of the present disclosure.

FIG. 3 is a sectional view illustrating the crane device according to one embodiment of the present disclosure. FIG. 3 is a cross-sectional view taken along line III-III of FIG. 2. FIG. 4 is a perspective view illustrating a first crane robot illustrated in FIG. 3. FIG. 5 is a perspective view illustrating a second crane robot illustrated in FIG. 3.

Figure 4:
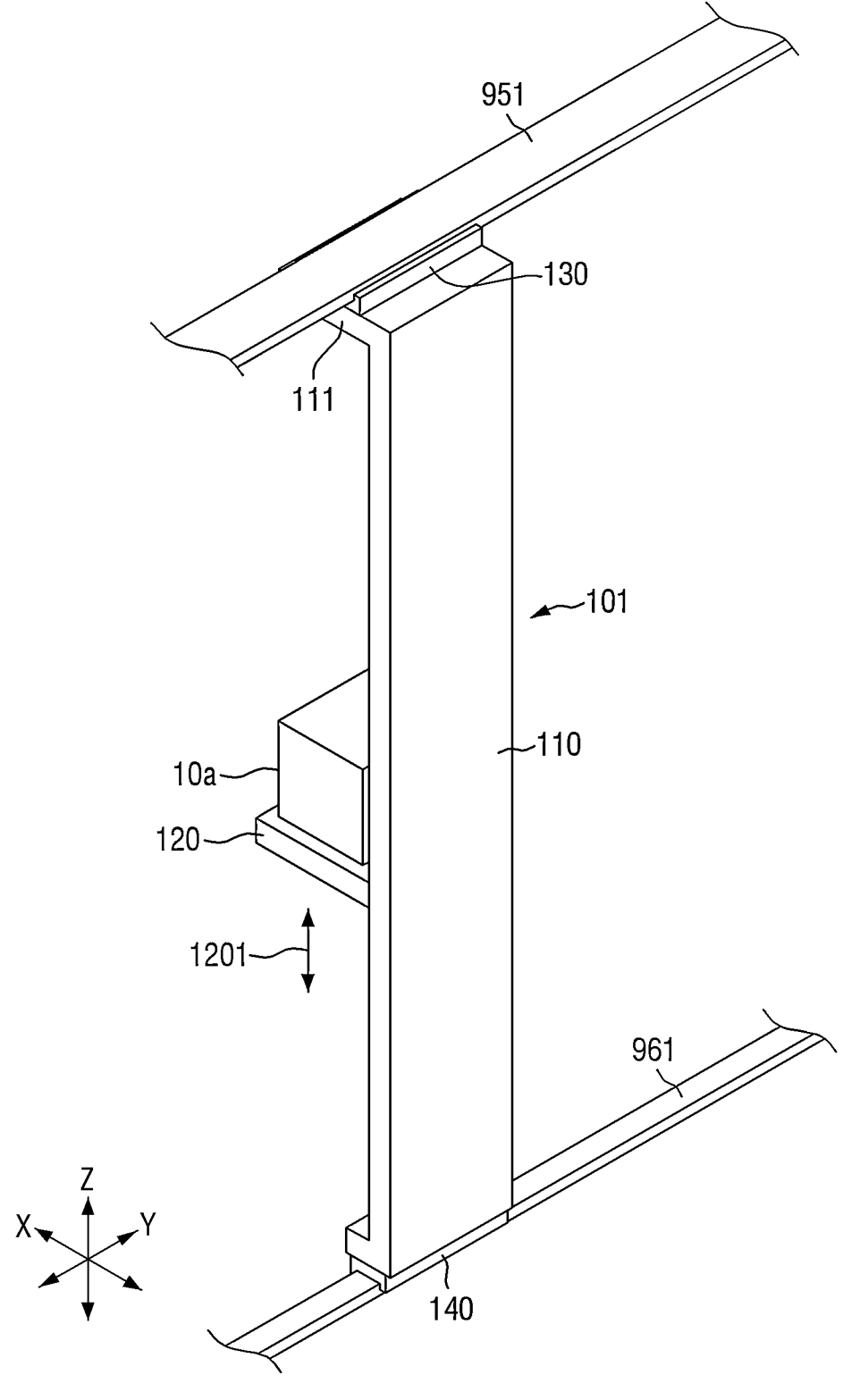
FIG. 4 is a perspective view illustrating a first crane robot illustrated in FIG. 3.
Figure 5:
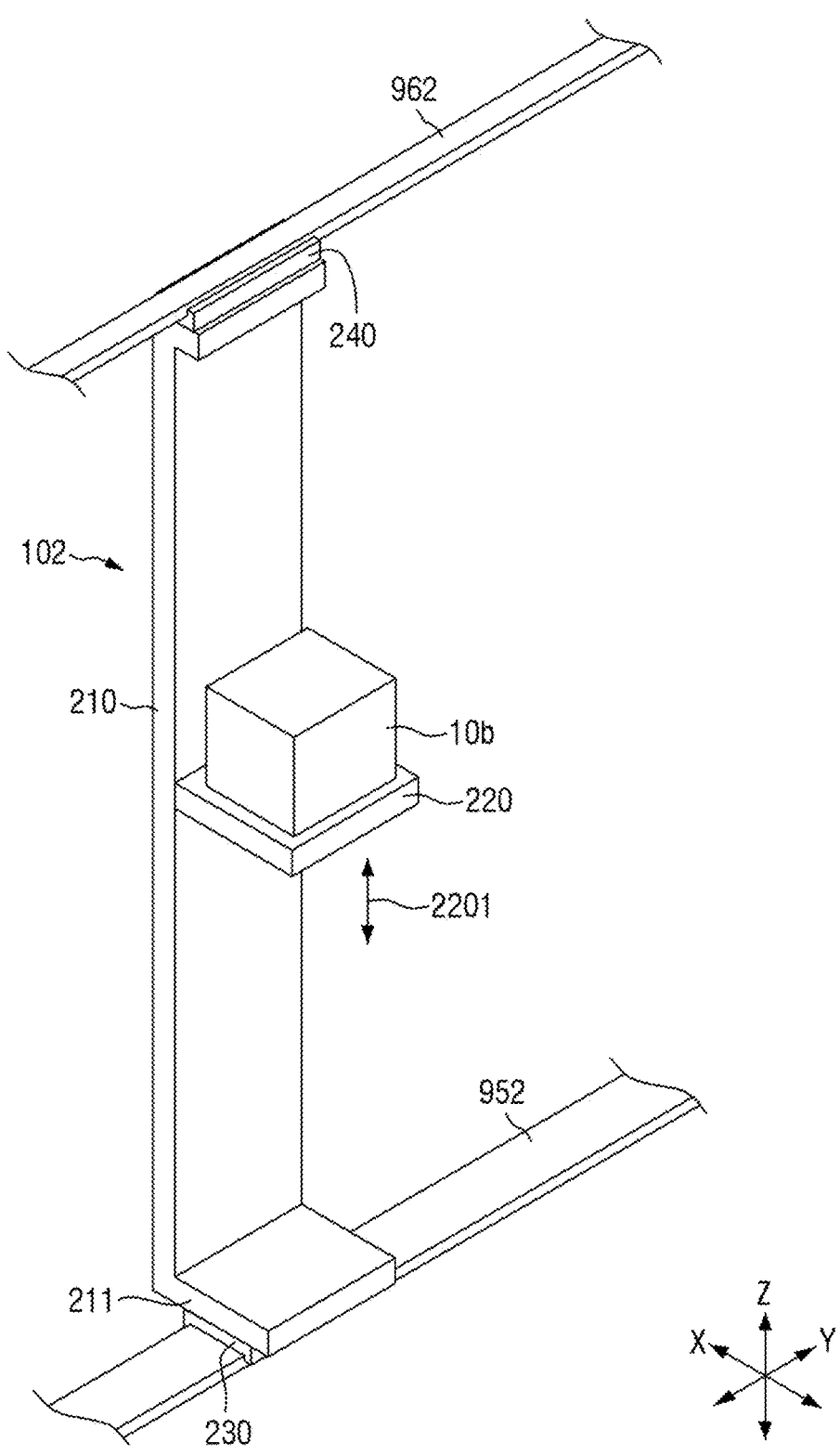
FIG. 5 is a perspective view illustrating a second crane robot illustrated in FIG. 3.

Referring to FIGS. 3 to 5, the crane device 100 includes a first crane robot 101 and a second crane robot 102.

As illustrated, the first crane robot 101 may be disposed at the first stocking unit 910, and the second crane robot 102 may be disposed at the second stocking unit 920.

The first crane robot 101 includes a first column 110, a first arm unit 120, and a first drive unit 130. Alternatively, the first crane robot 101 further includes a first lower guide unit 140.

The first column 110 can move in the first direction Y. Furthermore, the first column 110 extends long in the second direction Z.

The first arm unit 120 can move along the first column 110 (i.e., in the second direction Z) (see reference numeral 1201). The first arm unit 120 may perform a turn operation towards the first stocking unit 910 or the second stocking unit 920. Furthermore, the first arm unit 120 may perform a stretching operation to pick up the container 10 placed on shelves 919 and 929, or place a container 10a on the shelves 919 and 929. The first arm unit 120 may perform the stretching operation in the third direction X.

Although this is not illustrated separately, a belt member (not shown) extending in the second direction Z is installed in the first column 110, and the first arm unit 120 may be connected to the belt member to move in the second direction Z.

The first drive unit 130 is installed in an upper part of the first column 110 and allows the first column 110 to move in the first direction Y. The first drive unit 130 may include a first drive roller disposed on at least one side of the upper part the first column 110. A first drive rail 951 extending along the first direction Y is installed on an upper part of the stocker 1001, and the first drive unit 130 may move along the first drive rail 951.

Specifically, a first support block 111 protruding in the third direction X (or protruding in the second stocking unit 920) is formed in the upper part of the first column 110. The first drive unit 130 may be disposed on the first support block 111.

Alternatively, a first upper guide unit (not shown) may be further installed on the first support block 111. The first upper guide unit may move along a guide groove of a first upper guide rail (not shown) installed in the upper part of the stocker 1001.

The first lower guide unit 140 is installed on a lower part of the first column 110 to guide a movement direction of the first column 110. A first lower guide rail 961 extending along the first direction Y is installed in a lower part of the stocker 1001, and the first lower guide unit 140 may move along the first lower guide rail 961. For instance, the first lower guide rail 961 may be a linear motor (LM) guide rail, while the first lower guide unit 140 may be an LM block movable along the LM guide rail. Alternatively, the first lower guide unit 140 may be a guide roller, and the guide roller may move along a guide groove of the first lower guide rail 961.

The second crane robot 102 includes a second column 210, a second arm unit 220, and a second drive unit 230. Alternatively, the second crane robot 102 further includes a second upper guide unit 240.

The second column 210 can move in the first direction Y. Furthermore, the second column 210 extends long in the second direction Z.

The second arm unit 220 can move along the second column 210 (i.e., in the second direction Z) (see reference numeral 2201). The second arm unit 220 may perform the turn operation towards the first stocking unit 910 or towards the second stocking unit 920. Furthermore, the second arm unit 220 may perform the stretching operation to pick up the container 10 placed on the shelves 919 and 929, or place a container 10b on the shelves 919 and 929. The second arm unit 220 may perform the stretching operation in the third direction X.

Although this is not illustrated separately, the belt member extending in the second direction Z may be installed in the second column 210, and the second arm unit 220 may be connected to the belt member to move in the second direction Z.

The second drive unit 230 is installed in a lower part of the second column 210 and allows the second column 210 to move in the first direction Y. The second drive unit 230 may include a second drive roller disposed on at least one side of the lower part of the second column 210. A second drive rail 952 extending along the first direction Y is installed in the lower part of the stocker 1001, and the second drive unit 230 may move along the second drive rail 952.

Specifically, a second support block 211 protruding in the third direction X (or protruding in the first stocking unit 910) is formed in the lower part of the second column 210. The second drive unit 230 is disposed on the second support block 211.

Alternatively, a second lower guide unit (not shown) may be further installed on the second support block 211. The second lower guide unit may move along a guide groove of a second lower guide rail (not shown) installed in the lower part of the stocker 1001.

The second upper guide unit 240 is installed on an upper part of the second column 210 to guide a movement direction of the second column 210. A second upper guide rail 962 extending along the first direction Y is installed in the upper part of the stocker 1001, and the second upper guide unit 240 may move along the second upper guide rail 962. For instance, the second upper guide rail 962 may be the LM guide rail, while the second upper guide unit 240 may be the LM block movable along the LM guide rail. Alternatively, the second upper guide unit 240 may be a guide roller, and the guide roller may move along a guide groove of the second upper guide rail 962.

A plurality of crane robots 101 and 102 that operate individually are installed in the limited transport area 930 between the first stocking unit 910 and the second stocking unit 920. By installing the plurality of crane robots 101 and 102, it is possible to increase the movement speed of the container and reduce the bottleneck occurring in the stocker.

To this end, the first drive unit 130 of the first crane robot 101 is installed on the upper part of the first column 110, while the first lower guide unit 140 that does not require a driving force is installed in the lower part of the first column 110. Conversely, the second drive unit 230 of the second crane robot 102 is installed in the lower part of the second column 210, while the second upper guide unit 240 that does not require the driving force is installed in the upper part of the second column 210. The drive units 130 and 230 that occupy a relatively large amount of space are disposed far away from each other. Furthermore, a relatively small guide unit (e.g., 240) is disposed next to the drive unit (e.g., 130).

In addition, as illustrated in FIG. 3, the first drive rail 951 installed in the upper part of the stocker 1001 and configured to move the first crane robot 101 may at least partially overlap with the second drive rail 952 installed in the lower part of the stocker 1001 and configured to move the second crane robot 102. Herein, when the first crane robot 101 and the second crane robot 102 are disposed in parallel in the third direction X, the first arm unit 120 and the second arm unit 220 may at least partially overlap with each other in the second direction Z. Said differently, when the first crane robot 101 and the second crane robot 102 are disposed in parallel in the third direction X, the first arm unit 120 may collide with the second arm unit 220 when moving in the second direction Z.

However, the first crane robot 101 and the second crane robot 102 are not frequently disposed in parallel in the third direction X. When the first crane robot 101 and the second crane robot 102 are not disposed in parallel in the third direction X, the first arm unit 120 does not collide with the second arm unit 220 when moving in the second direction Z.

Figure 6:
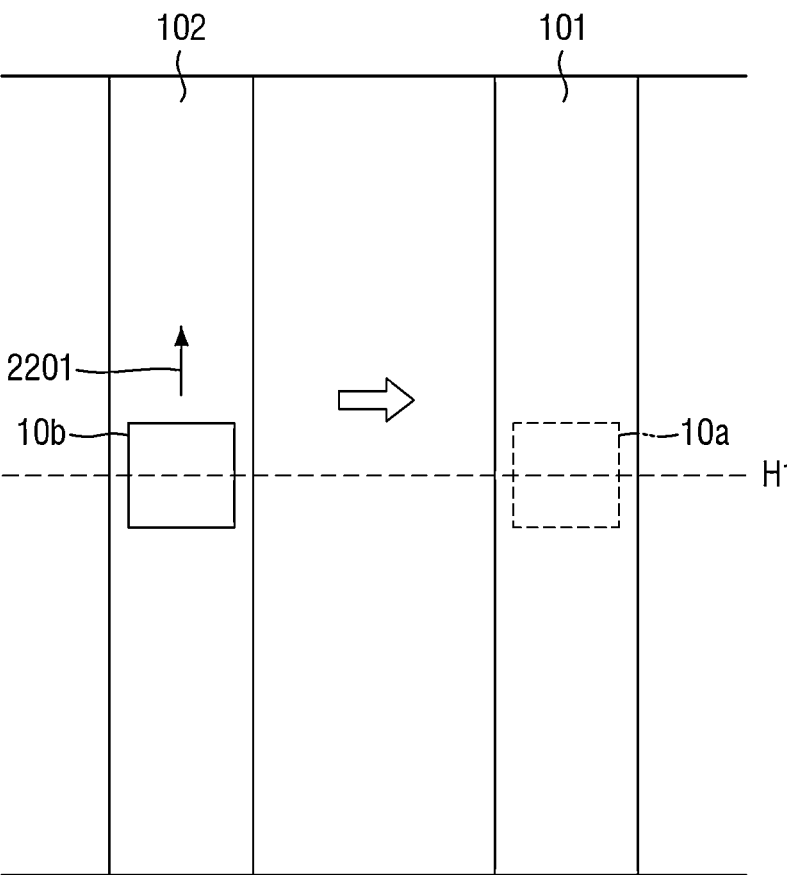
FIGS. 6 to 8 are conceptual views illustrating operations of the first crane robot and the second crane robot.
Figure 6:
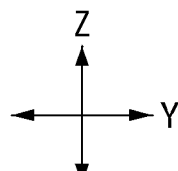
Figure 7:
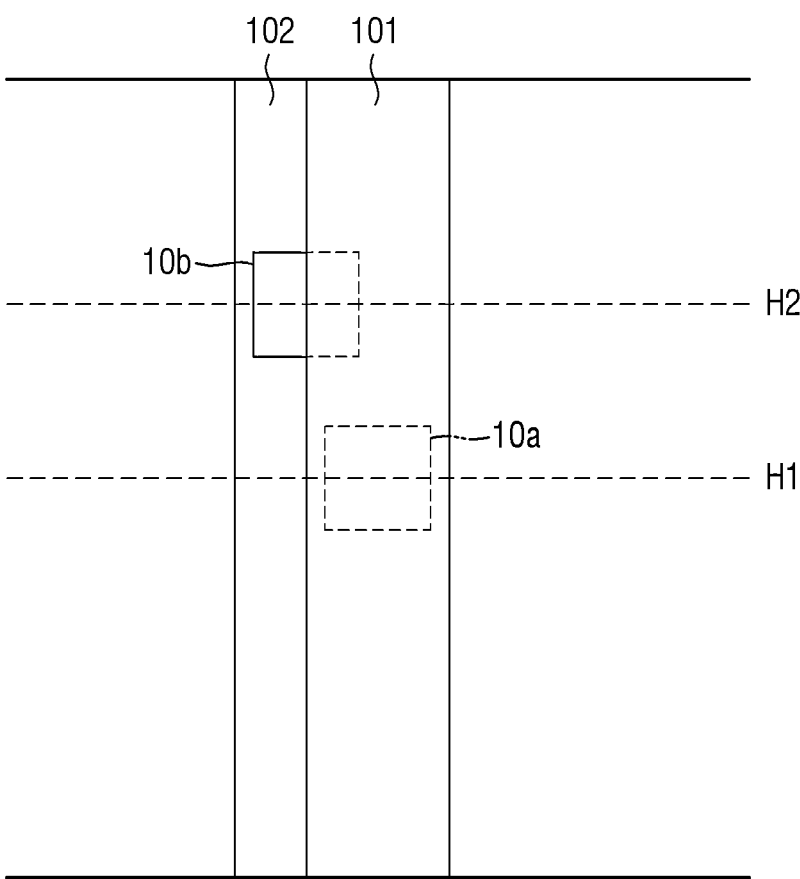
Figure 7:
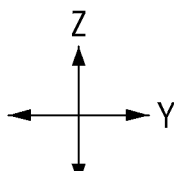
Figure 8:
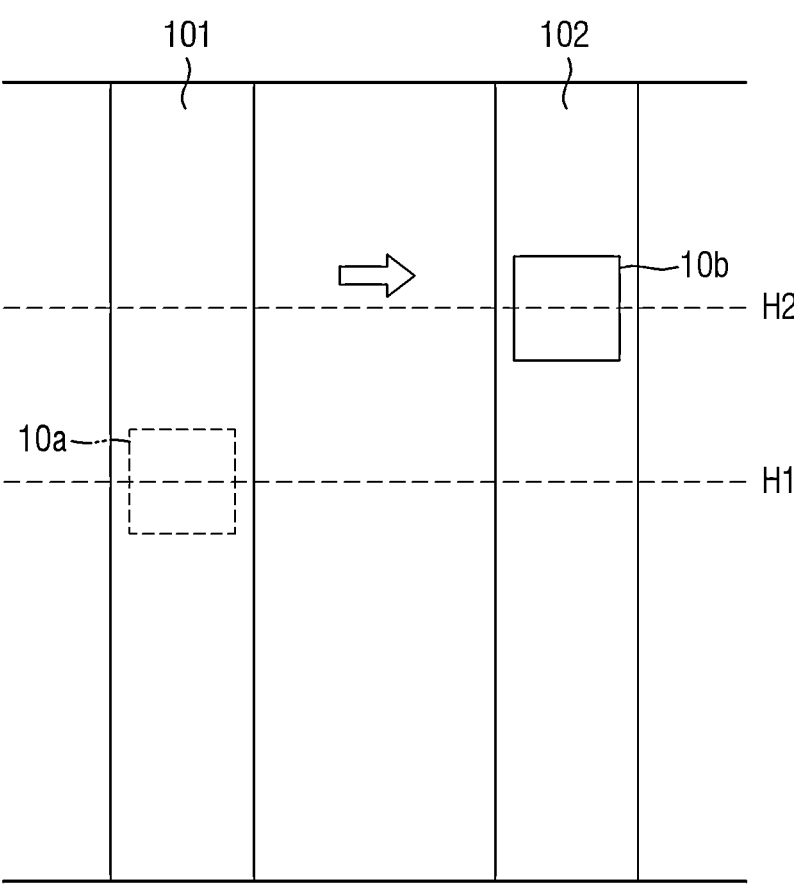

Furthermore, when there is a risk of collision between the first crane robot 101 (i.e., the first arm unit 120) and the second crane robot 102 (i.e., the second arm unit 220), the collision may be avoided as follows. Herein, an operation in which the first crane robot 101 is prevented from colliding with the second crane robot 102 will be described with reference to FIGS. 6 to 8. FIGS. 6 to 8 are conceptual views illustrating operations of the first crane robot and the second crane robot.

First, referring to FIG. 6, the first arm unit 120 (or the container 10a) of the first crane robot 101 is disposed at a height H1. The second arm unit (or the container 10b) of the second crane robot 102 is disposed at the height H.

Herein, a controller configured to control the crane device 100 has to move the second crane robot 102 so that the second crane robot 102 can pass the first crane robot 101 (i.e., in the first direction Y). In that case, the controller checks the heights of the first arm unit 120 (or the container 10a) of the first crane robot 101 and the second arm unit (or the container 10b) of the second crane robot 102. This makes it possible to confirm a probability of collision between the first crane robot 101 and the second crane robot 102. As a result of confirming the probability of collision, when the probability of collision is determined to appear, the controller moves the second arm unit 220 (or the container 10b) of the second crane robot 102 to another height (i.e., in the second direction Z).

Referring to FIG. 7, the second crane robot 102 begins to overlap with the first crane robot 101. Since the second arm unit (or the container 10b) is disposed at a height H2 and the first arm unit (or the container 10a) is disposed at the height H1, the first and second arm units do not collide with each other.

Referring to FIG. 8, the second crane robot 102 may completely pass the first crane robot 101 and arrive at an arrival position without any collision.

Figure 9:
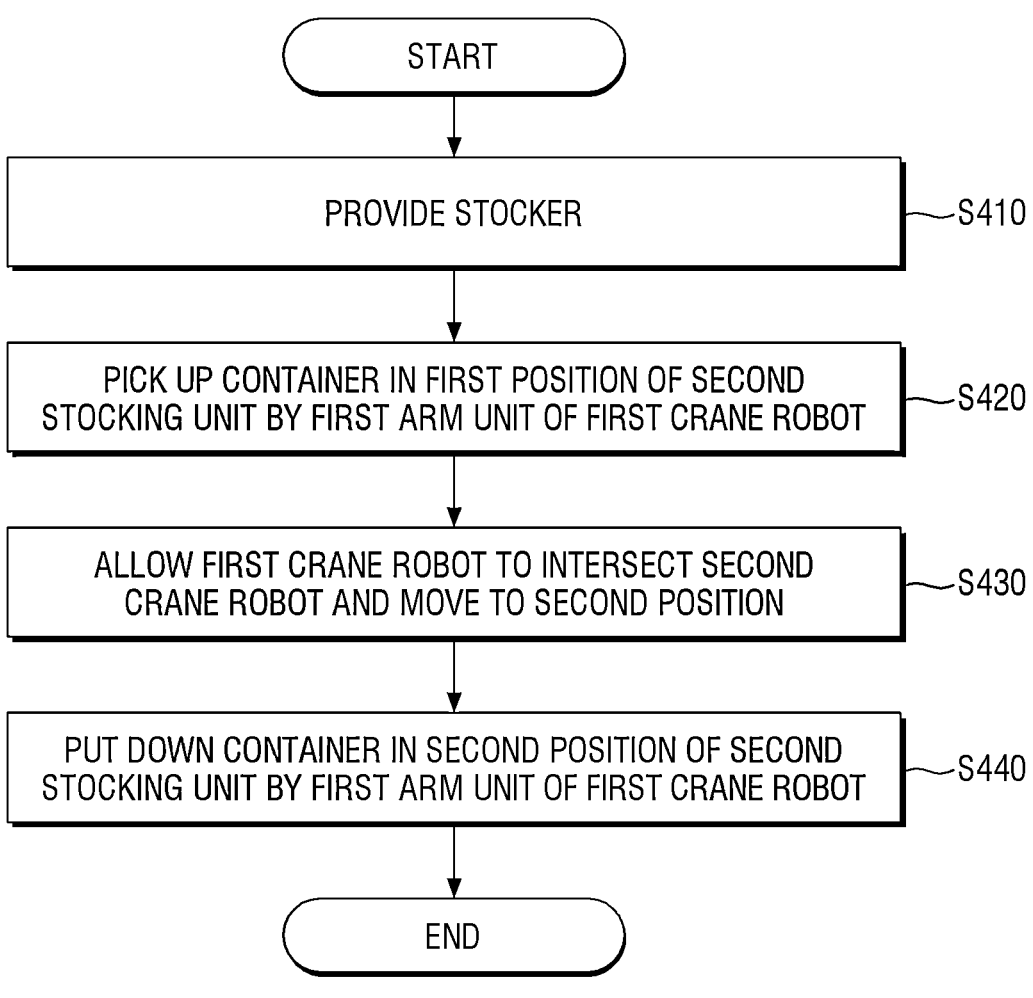
FIG. 9 is a flowchart illustrating a method of driving the crane device according to some embodiments of the present disclosure.

FIG. 9 is a flowchart illustrating a method of driving the crane device according to some embodiments of the present disclosure.

Referring to FIG. 9, first, the stocker is provided (S410).

Specifically, as illustrated in FIG. 3, the stocker 1001 includes the first stocking unit 910, the second stocking unit 920, and the first crane robot 101 and the second crane robot 102 disposed between the first stocking unit 910 and the second stocking unit 920.

The first crane robot 101 includes the first column 110 movable in the first direction Y, the first arm unit 120 movable along the first column 110, and the first drive unit 130 installed in the upper part of the first column 110 and configured to move the first column 110 in the first direction Y. The first crane robot 101 may further include the first lower guide unit 140 installed in the lower part of the first column 110.

The second crane robot 102 includes the second column 210 movable in the first direction Y, the second arm unit 220 movable along the second column 210, and the second drive unit 230 installed in the lower part of the second column 210 and configured to move the second column 210 in the first direction Y. The second crane robot 102 may further include the second upper guide unit 240 installed in the upper part of the second column 210.

Then, the first arm unit 120 of the first crane robot 101 picks up the container in a first position of the second stocking unit 920 (S420). Herein, the first position may refer to a position where a pick-up container is placed, as any one of the plurality of shelves of the second stocking unit 920. Alternatively, the first position may be the inlet port 921 (see FIG. 2) installed in the second stocking unit 920.

Then, the first crane robot 101 intersects the second crane robot 102 and moves to a second position (S430).

Herein, for instance, as illustrated in FIG. 7, at the time of intersecting the first column 110 and the second column 210, the first arm unit 120 and the second arm unit 220 are disposed at different heights (see H1 and H2). At the time of intersecting the first column 110 and the second column 210, the first arm unit 120 at least partially overlaps with the second arm unit 220 when viewed in the second direction Z.

Then, the first arm unit 120 of the first crane robot 101 puts down the container in the second position of the second stocking unit 920 (S440). Herein, the second position refers to a position where the picked-up container is placed, as any one of the plurality of shelves of the second stocking unit 920. Alternatively, the second location may be the outlet port 922 (see FIG. 2) installed in the second stocking unit 920.

Figure 10:
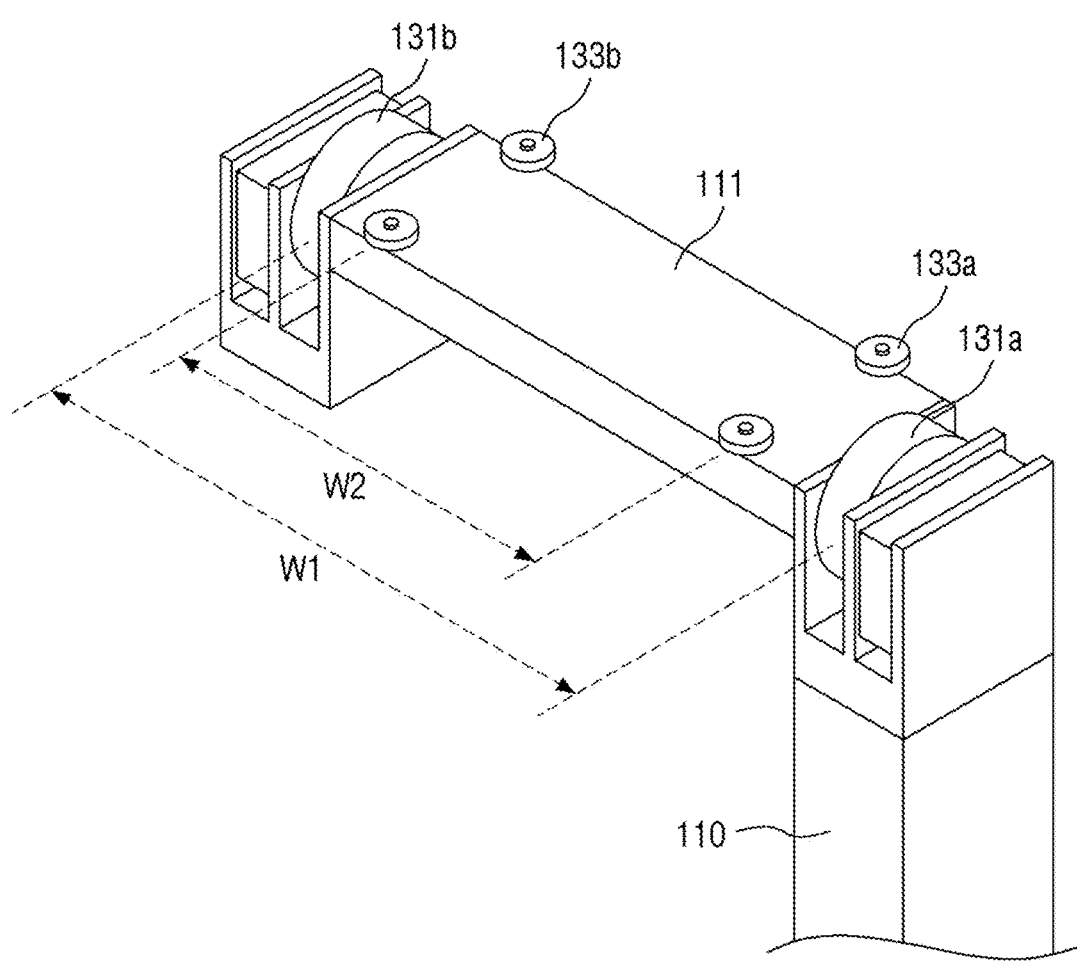
FIG. 10 is a view illustrating an implementation example of a first drive unit in the crane device according to another embodiment of the present disclosure.

FIG. 10 is a view illustrating an implementation example of the first drive unit in the crane device according to another embodiment of the present disclosure. The implementation example of the first drive unit 130 of the first crane robot 101 has been illustrated and is equally applicable to the second drive unit 230 of the second crane robot 102.

Referring to FIG. 10, the first support block 111 is installed in the upper part of the first column 110 of the first crane robot 101.

The first drive unit 130 and the first upper guide unit may be installed in the first support block 111. The first drive unit 130 may include first drive rollers 131a and 131b that rotate by a driving force and move along a driving surface of the first drive rail 951 (see FIG. 3) installed in the upper part of the stocker 1001.

In addition, the first upper guide unit may include first upper guide rollers 133a and 133b that move along a guide groove of the first drive rail 951.

A distance W1 between the first drive rollers 131a and 131b disposed at both sides of the first support block 111 may exceed a distance W2 between the first upper guide rollers 133a and 133b disposed at both sides of the first support block 111.

Figure 11:
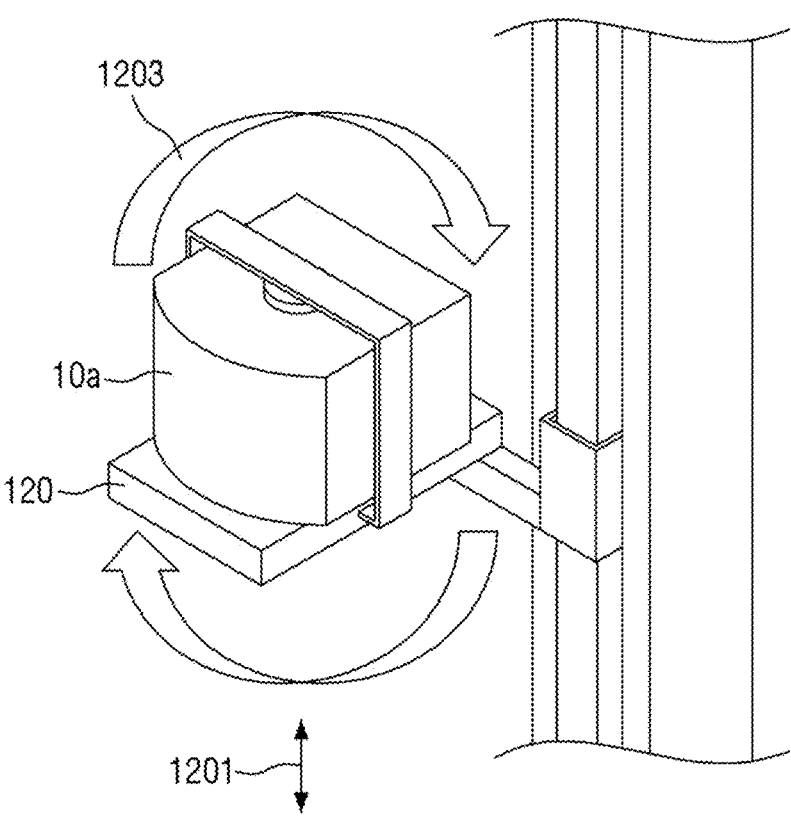
FIG. 11 is a view illustrating an implementation example of a first arm unit in the crane device according to another embodiment of the present disclosure.

FIG. 11 is a view illustrating an implementation example of the first arm unit in the crane device according to another embodiment of the present disclosure. The implementation example of the first arm unit 120 of the first crane robot 101 has been illustrated and is equally applicable to the second arm unit 220 of the second crane robot 102.

Referring to FIG. 11, the first arm unit 120 of the first crane robot 101 supports the container 10a. The first arm unit 120 may move up and down along the first column 110 (see reference numeral 1201) and perform the turn operation to access both the first stocking unit 910 and the second stocking unit 920 (see reference numeral 1203).

Figure 12:
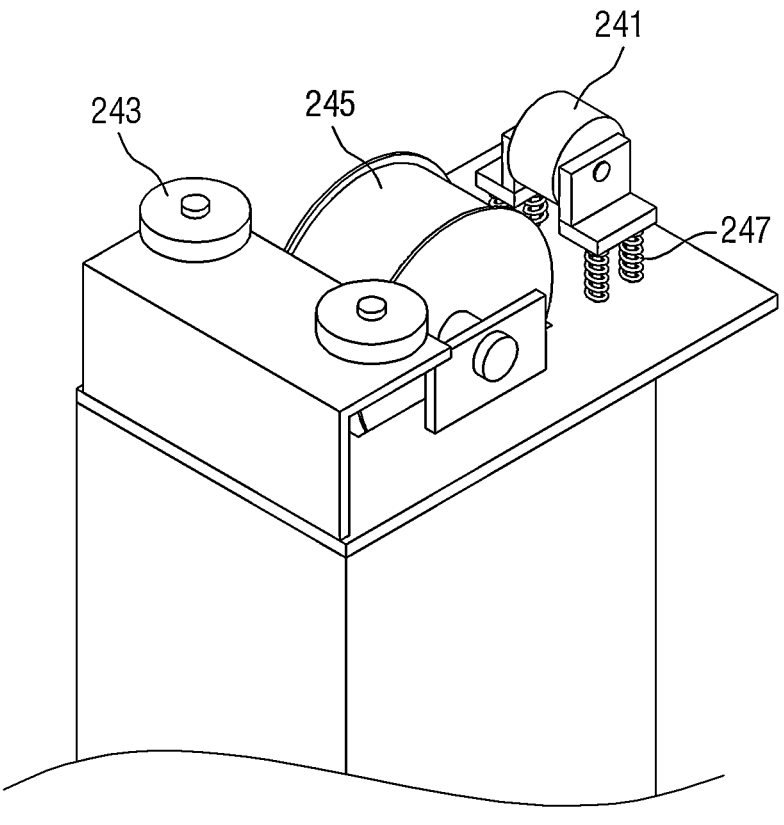
FIG. 12 is a view illustrating an implementation example of a second upper guide unit in the crane device according to another embodiment of the present disclosure.

FIG. 12 is a view illustrating an implementation example of the second upper guide unit in the crane device according to another embodiment of the present disclosure. The implementation example of the second upper guide unit 240 of the second crane robot 102 has been illustrated and is equally applicable to the first lower guide unit 140 of the first crane robot 101.

The second upper guide unit 240 of the second crane robot 102 illustrated in FIG. 3 minimizes the volume by including only the guide roller without the drive roller.

On the other hand, the second upper guide unit 240 of the second crane robot 102 illustrated in FIG. 12 includes not only the guide roller 243, but also the drive roller 241 rotatable by the driving force. A shock observer 247 configured to absorb impact during the operation of the drive roller 241 is also installed in the second upper guide unit 240.

Meanwhile, reference numeral 245 refers to a roller that rotates the belt member to move the second arm unit 220.

Although the embodiments of the present disclosure have been described above with reference to the accompanying drawings, the present disclosure is not limited to the disclosed embodiments, but may be implemented in various different ways, and the present disclosure may be embodied in many different forms without changing technical subject matters and essential features as will be understood by those skilled in the art. Therefore, embodiments set forth herein are exemplary only and not to be construed as a limitation.

What is claimed is:

1. A crane device, comprising:
   a first crane robot; and
   a second crane robot, the first crane robot and the second crane robot being installed in a same space that exists directly between two consecutive stocking units having shelves,
   wherein the first crane robot comprises:
   a first column configured to be movable in a first direction and extend in a second direction;
   a first arm unit configured to be movable along the first column; and
   a first drive unit installed in an upper part of the first column and configured to move the first column in the first direction, the first drive unit at the upper part of the first column being a sole drive unit of the first column, and
   the second crane robot comprises:
   a second column configured to be movable in the first direction and extend in the second direction and spaced apart from the first column;
   a second arm unit configured to be movable along the second column; and
   a second drive unit installed in a lower part of the second column and configured to move the second column in the first direction, the second drive unit at the lower part of the second column being the sole drive unit of the second column,
   wherein, when the first column and the second column are disposed in parallel in a third direction perpendicular to the first and second directions, the first arm unit at least partially overlaps with the second arm unit in the second direction.

2. The crane device of claim 1, further comprising: a first upper guide unit installed in the upper part of the first column and configured to guide a movement direction of the first column.

3. The crane device of claim 1, further comprising:
   a first support block installed in the upper part of the first column and protruding in the third direction perpendicular to the first and second directions, and
   a second support block installed in the lower part of the second column and protruding in the third direction,
   wherein the first drive unit is formed at the first support block, the second drive unit is formed at the second support block, and, when the first column and the second column are disposed in parallel in the third direction, the first support block and the second support block at least partially overlap each other.

4. The crane device of claim 3, wherein the first drive unit includes a plurality of first drive rollers disposed at both sides of the first support block in the third direction, the first upper guide unit includes a plurality of first upper guide rollers disposed at both sides of the first support block in the third direction, and a distance between the first drive rollers disposed at both sides of the first support block exceeds a distance between the first upper guide rollers disposed at both sides of the first support block.

5. The crane device of claim 3, wherein the first drive unit includes a first drive roller disposed on at least one side of the first support block, the first upper guide unit includes a first upper guide roller disposed on the at least one side of the first support block, a first drive rail extending in the first direction is installed in an upper part of a stocker, and the first drive roller rotates by a driving force and moves along a driving surface of the first drive rail, and the first upper guide roller moves along a guide groove of the first drive rail.

6. The crane device of claim 1, further comprising a first lower guide unit installed in a lower part of the first column and configured to guide the movement direction of the first column.

7. The crane device of claim 6, wherein an LM guide rail extending in the first direction is installed in a lower part of a stocker, and the first lower guide unit includes an LM block movable along the LM guide rail.

8. The crane device of claim 1, further comprising:

a second lower guide unit configured to guide a movement direction of the second column, a second support block installed in the lower part of the second column and protruding in the third direction, wherein the second drive unit includes a second drive roller disposed on at least one side of the second support block, and the second lower guide unit includes a second lower guide roller disposed on at least one side of the second support block.

9. The crane device of claim 8, wherein a second drive rail extending in the first direction is installed in the lower part of a stocker, the second drive roller rotates by a driving force and moves along a driving surface of the second drive rail, the second guide roller moves along a guide groove of the second drive rail, and the first drive rail at least partially overlaps with the second drive rail in the second direction.

10. The crane device of claim 1, further comprising: a second upper guide unit installed in an upper part of the second column and configured to guide the movement direction of the second column.

11. The crane device of claim 1, further comprising:

a belt member installed in the first column and extending and disposed in the second direction, wherein the first arm unit is connected to the belt member and is movable along the second direction.

12. A stocker, comprising:

a first stocking unit including a plurality of first shelves and extending in a first direction;

a second stocking unit spaced apart from the first stocking unit, including a plurality of second shelves and extending in the first direction; and a first crane robot and a second crane robot both disposed within a same space existing directly between the first stocking unit and the second stocking unit, wherein the first crane robot comprises:

a first column configured to be movable in the first direction and extend in a second direction;

a first arm unit configured to be movable along the first column;

a first support block installed on an upper part of the first column and protruding in a third direction perpendicular to the first direction and the second direction;

a first drive unit installed in the first support block and configured to move the first column in the first direction, the first drive unit at the upper part of the first column being a sole drive unit of the first column; and a first lower guide unit installed in a lower part of the first column and configured to guide a movement direction of the first column, and the second crane robot comprises:

a second column configured to be movable in the first direction and extend in the second direction and spaced apart from the first column;

a second arm unit configured to be movable along the second column;

a second support block installed in a lower part of the second column and protruding in the third direction;

a second drive unit installed in the second support block and configured to move the second column in the first direction, the second drive unit at the lower part of the second column being the sole drive unit of the second column; and a second upper guide unit installed in an upper part of the second column and configured to guide a movement direction of the second column.

13. The stocker of claim 12, wherein the first crane robot further includes a first upper guide unit installed in the first support block and configured to guide the movement direction of the first column, the first drive unit includes a plurality of first drive rollers disposed at both sides of the first support block in the third direction, the first upper guide unit includes a plurality of first upper guide rollers disposed at both sides of the first support block in the third direction, and wherein a distance between the first drive rollers disposed at both sides of the first support block exceeds a distance between the first upper guide rollers disposed at both sides of the first support block.

14. The stocker of claim 13, wherein a first drive rail extending in the first direction is installed on an upper part of the stocker, the plurality of first drive rollers rotate by a driving force and move along a driving surface of the first drive rail, and the plurality of first upper guide rollers move along a guide groove of the first drive rail.

15. The stocker of claim 14, wherein a second drive rail extending in the first direction and corresponding to the second drive unit is installed in the lower part of the stocker, and the first drive rail at least partially overlaps the second drive rail.

16. The stocker of claim 12, wherein an LM guide rail extending in the first direction is installed in the lower part of a stocker, and the first lower guide unit includes an LM block movable along the LM guide rail.

17. The stocker of claim 12, wherein the second stocking unit includes an inlet port configured to carry in a container and an outlet port configured to carry out the container.

18. A driving method of a crane device, the method comprising:

providing a stocker comprising: a first stocking unit including a plurality of first shelves and extending in a first direction; a second stocking unit spaced apart from the first stocking unit and including a plurality of second shelves and extending in the first direction; and a first crane robot and a second crane robot both disposed within a same space existing directly between the first stocking unit and the second stocking unit, wherein the first crane robot comprises: a first column configured to be movable in the first direction; a first arm unit configured to be movable along the first column; and a first drive unit installed in an upper of the first column and configured to move the first column in the first direction, and the second crane robot comprises: a second column configured to be movable in the first direction; a second arm unit configured to be movable along the second column; and a second drive unit installed in a lower part of the second column and configured to move the second column in the first direction;

picking up a container in a first position of the second stocking unit by the first arm unit of the first crane robot;

allowing the first crane robot to intersect the second crane robot and move to a second position, wherein, at the time of intersecting the first crane robot and the second crane robot, the first arm unit and the second arm unit are disposed at different heights, but at least partially overlap with each other; and putting down the container in the second position of the second stocking unit by the first arm unit of the first crane robot, wherein the first drive unit at the upper part of the first column is a sole drive unit of the first column, and wherein the second drive unit at the lower part of the second column is the sole drive unit of the second column.

19. The driving method of a crane device of claim 18, further comprising: after the first arm unit picks up the container from the first position, checking the height of the first arm unit and the height of the second arm unit and confirming the probability of collision between the first arm unit and the second arm unit.

20. The driving method of a crane device of claim 19, further comprising: when a probability of collision is determined to appear as a result of confirming the probability of collision, moving the first arm unit at a height different from that of the second arm unit.

* * * * *